(12) United States Patent
Kitagawa et al.

(10) Patent No.: US 8,437,140 B2
(45) Date of Patent: May 7, 2013

(54) ELECTRONIC PACKAGE, DISPLAY, AND ELECTRONIC DEVICE

(75) Inventors: Kohei Kitagawa, Osaka (JP); Nobuaki Takahashi, Osaka (JP); Masahiro Imai, Osaka (JP); Koichi Yoshioka, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 195 days.

(21) Appl. No.: 12/988,990

(22) PCT Filed: Mar. 2, 2009

(86) PCT No.: PCT/JP2009/053836
§ 371 (c)(1),
(2), (4) Date: Oct. 21, 2010

(87) PCT Pub. No.: WO2009/130945
PCT Pub. Date: Oct. 29, 2009

(65) Prior Publication Data
US 2011/0038128 A1      Feb. 17, 2011

(30) Foreign Application Priority Data
Apr. 22, 2008  (JP) ................ 2008-111061

(51) Int. Cl.
*H05K 5/00* (2006.01)
(52) U.S. Cl.
USPC ........... 361/752; 361/749; 361/730; 361/796; 361/802; 361/679.01; 361/679.02; 361/679.28
(58) Field of Classification Search ........... 361/749, 361/752, 730, 732, 796, 799–802, 679.01, 361/679.02, 679.27, 679.28; 174/50.51, 174/51, 559–562, 58, 254, 257, 261; 439/67, 439/77, 865–868, 877–879; 349/149, 150, 349/58; 345/905
See application file for complete search history.

(56) References Cited

U.S. PATENT DOCUMENTS

| | | | |
|---|---|---|---|
| 6,342,933 B1 | 1/2002 | Nakamura et al. | |
| 6,462,958 B2 * | 10/2002 | Ogata | 361/800 |
| 6,999,323 B1 * | 2/2006 | Aronson et al. | 361/753 |
| 7,364,437 B2 * | 4/2008 | Xu et al. | 439/76.1 |
| 2001/0000763 A1 | 5/2001 | Muramatsu | |
| 2004/0026056 A1 | 2/2004 | Schweiger | |
| 2004/0183959 A1 | 9/2004 | Ishida | |

(Continued)

FOREIGN PATENT DOCUMENTS

| | | |
|---|---|---|
| EP | 1 892 560 A2 | 2/2008 |
| JP | 11-52881 A | 2/1999 |

(Continued)

OTHER PUBLICATIONS

European Search Report for Application No. 09735308.0-2205; Mar. 18, 2011.

(Continued)

*Primary Examiner* — Hoa C Nguyen
(74) *Attorney, Agent, or Firm* — Birch, Stewart, Kolasch & Birch, LLP

(57) ABSTRACT

An FPC board (1) is mounted on a front bezel (BZ1) and a rear bezel (BZ2). The outer claw (CW1) of the front bezel (BZ1) and the inner claw (CW2) of the rear bezel (BZ2) are engaged with each other while holding the ground portion (12) of the FPC board (1) therebetween.

11 Claims, 14 Drawing Sheets

U.S. PATENT DOCUMENTS

| | | |
|---|---|---|
| 2007/0019275 A1 | 1/2007 | Okuda |
| 2007/0117418 A1 | 5/2007 | Azuma et al. |
| 2007/0132908 A1 | 6/2007 | Kim et al. |
| 2007/0290965 A1 | 12/2007 | Shiraishi |
| 2008/0068785 A1* | 3/2008 | Noguchi et al. ............... 361/681 |

FOREIGN PATENT DOCUMENTS

| | | |
|---|---|---|
| JP | 2002-372922 A | 12/2002 |
| JP | 2005-55512 A | 3/2005 |
| JP | 2005-283828 A | 10/2005 |
| JP | 2007-121594 A | 5/2007 |
| JP | 2007-140271 A | 6/2007 |
| JP | 2007-171459 A | 7/2007 |
| RU | 2 210 197 C1 | 8/2003 |
| RU | 2 234 205 C1 | 8/2004 |
| RU | 1840492 A1 | 3/2007 |
| RU | 2006129798 A | 3/2008 |

OTHER PUBLICATIONS

European Office Action for corresponding application No. 09 735 308.0-2205 dated Feb. 9, 2012.

* cited by examiner

ELECTRONIC PACKAGE, DISPLAY, AND ELECTRONIC DEVICE

TECHNICAL FIELD

The present invention is related to an electronic package, a display, and an electronic device.

BACKGROUND ART

Countermeasures against static electricity have conventionally been taken in various electronic devices. For example, a countermeasure against static electricity is taken in a liquid crystal display device (a display) shown in Patent Document 1.

In the liquid crystal display device disclosed in Patent Document 1, between a first and second holding members functioning as an outer package (a housing unit), an FPC (Flexible Printed Circuits) board and a liquid crystal display panel are laid in this order on the second holding member. And a pressure-contact type connector is held between a liquid-crystal-drive-signal-pattern exposure portion formed on the front surface of the FPC board (a circuit board) and a transparent electrode of the liquid crystal display panel.

On the other hand, on the rear surface of the FPC board, a ground pattern exposure portion is formed, and the pressure-contact type connector exerts a reaction force against compression to press the ground pattern exposure portion against the second holding member which is electrically conductive. This allows static electricity to escape to the second holding member via the ground pattern exposure portion. Thus, this liquid crystal display device is free of static electricity-related malfunctions.

Patent Document 1: JP-A-H11-52881

DISCLOSURE OF THE INVENTION

Problems to be Solved by the Invention

Adoption of a pressure-contact type connector is indispensable to this type of liquid crystal display device, however, and it disadvantageously increases the number of components. In addition, if a pressure-contact type connector exerts a reaction force against compression that is larger than a given magnitude, the engagement between the first and second holding member may be released. That is, in the housing unit incorporating the FPC board, the degree of engagement between the first and second holding members functioning as the housing may be lowered by the reaction force against compression exerted by the pressure-contact type connector (incidentally, such a housing unit incorporating an FPC board is called an electronic package).

The present invention has been made in view of the foregoing. An object of the present invention is to provide an electronic package and the like that securely makes static electricity escape, and that is integrated through strong engagement, in spite of a reduced number of components.

Means for Solving the Problem

According to one aspect of the present invention, an electronic package is provided with: a housing unit that is composed of a plurality of housings integrally engaged with each other, and a circuit board that is incorporated in the housing unit, and that includes a supply conductor. Here, at least one of the housings engaged with each other is formed of electrically conductive material, the housings include engagement portions that engage with each other to unite the housings, and a ground portion in the circuit board is held by and between the engagement portions.

With this structure, without adopting an extra member such as a pressure-contact type connector, static electricity flows via the ground portion to the engagement portions (and thus to a housing formed of conductive material). This helps prevent various problems due to static electricity.

Furthermore, since the engagement portions are engaged with each other with the ground portion and thus the circuit board interposed therebetween, the engagement portions do not have to be located avoiding the circuit board. As a result, the engagement portions are located at positions at which they need to be located in order to firmly unite the housings, without any restriction due to the circuit board. That is, the engagement portions can be located freely.

It is preferable that the ground portion be film-shaped, that the engagement portions that engage with each other be claw-shaped, and that the claw-shaped engagement portions interlock with each other with the film-shaped ground portion interposed therebetween.

With this structure, the claw-shaped engagement portion of one of the housings presses and sinks into a front surface of the film-shaped ground portion, while the claw-shaped engagement portion of the other one of the housings presses and sinks into a rear surface of the film-shaped ground portion, and thereby the engagement portions of both of the housings are securely engaged with each other. As a result, static electricity securely flows to the engagement portions (and thus to the housings) via the ground portion, and the housings are strongly united.

It is preferable that the claw-shaped engagement portions be formed by raising cut portions formed in the housings.

With this structure, even if a conductivity-impairing coating is applied to the housings, as long as the housings are formed of electrically conductive material, the electrically conductive material is exposed at surfaces of the engagement portions and in contact with the ground portion. Thus, static electricity securely flows to the engagement portions.

It is preferable that the ground portion be film-shaped, that, of the engagement portions engaging each other, one be a protrusion-shaped engagement portion and another be a recess-shaped engagement portion, and that the protrusion-shaped engagement portion and the recess-shaped engagement portion be engaged with each other with the film-shaped ground portion interposed therebetween.

With this structure, since the protrusion-shaped engagement portion is fitted into the recess-shaped engagement portion, the thickness of the protrusion-shaped engagement portion is not added to the thickness of the housing unit. Thus, for example, if the engagement portions are located on side walls of the housing unit, the thickness of the side walls can be comparatively thin.

It is preferable that the ground portion be a thin portion formed by raising a cut portion of the circuit board, and that the ground portion, which is thin, is pressed by a press member against the housings, which are formed of electrically conductive material.

With this structure, the thin ground portion is movable along a distance corresponding to a distance along which it moves to stand up from the circuit board, and this helps further increase the freedom in the positioning of the engagement portions. Moreover, since the press member presses the ground portion against the housings, which are formed of conductive material, static electricity more securely escapes to the housings.

It is preferable that the engagement portions that engage with each other be located on side walls of the housing unit.

With this structure, the thickness of the engagement portions is not added to the thickness of the housing unit. Thus, a comparatively thin electronic package is accomplished.

It can be said that the present invention also includes a display incorporating such an electronic package as described above.

In such a display, it is preferable that the circuit board be connected to a display panel for displaying a display image, the display panel having a control element placed thereon along the circuit board, that the control element include a plurality of element conductors, a main-element-conductor group, which is a group of main element conductors, being included in the element conductors, and that, assuming that supply conductors of the circuit board that are connected to the main element conductors are main supply conductors, and that a group of the main supply conductors is a main-supply-conductor group, the ground portion be located at an isolation position avoiding the main-supply-conductor group.

With this structure, for example, the main supply conductors do not need to have extra length to avoid the ground portion. As a result, not only the cost for the circuit board is reduced, but also the main supply conductors can be easily formed on the circuit board.

An example of the isolation position described above is a position along an outer edge of the circuit board. Other examples of the display are as follows.

That is, in the display, a sub-element-conductor group, which is a group of sub element conductors, may be included in the plurality of element conductors, and, assuming that supply conductors of the circuit board that are connected to the sub element conductors are sub supply conductors, that a group of the sub element conductors is a sub-supply-conductor group, and that a line along a shape of the circuit board which bends is a bend line, the isolation position may be located on the bend line that overlaps the sub-supply-conductor group.

It is preferable that at least part of the main supply conductors be located at a bending portion of the circuit board, and the at least part of the main supply conductors that are located at the bending portion of the circuit board be shaped to fit the shape of the circuit board that bends.

With this structure, even if the circuit board is bent, no oblique load is applied to the main supply conductors. This helps prevent damage to the main supply conductors.

It can be said that the present invention also includes an electronic device incorporating a display as described above.

Advantages of the Invention

According to the present invention, since the ground portion is connected via the engagement portions to a housing that is a conductive portion, static electricity escapes to the housing. Moreover, the engagement portions engage with each other with the ground portion interposed therebetween, the positions of the engagement portions are not restricted due to the circuit board. As a result, the engagement portions are freely located at positions where they need to be located to firmly unite the housings.

LIST OF REFERENCE SYMBOLS

Figure 1:
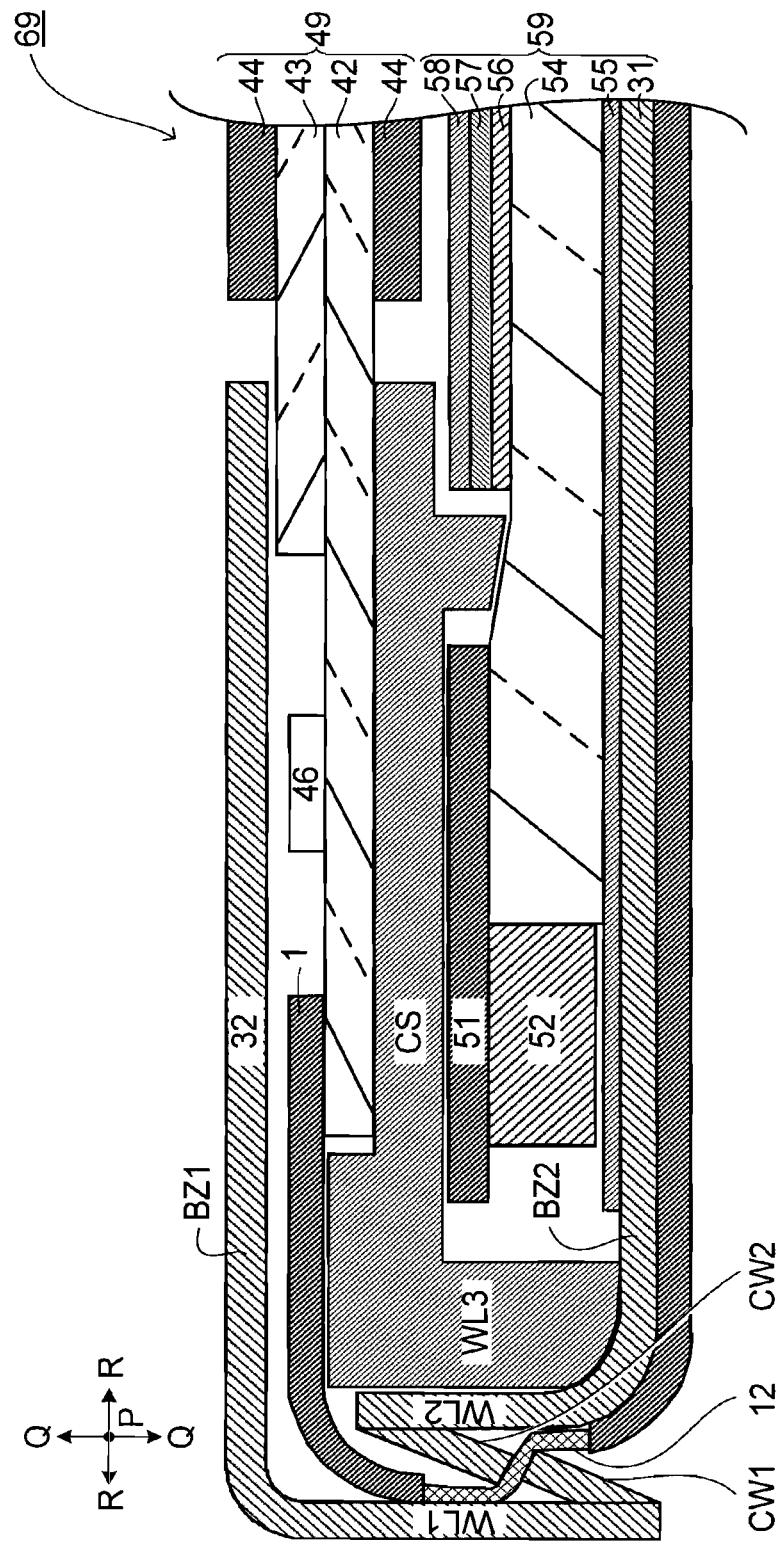
[FIG. 1] is a sectional view of a liquid crystal display device of FIG. 2 taken along line A1-A1' of FIG. 2, and viewed from the direction indicated by arrows shown in FIG. 2.

BZ bezel (housing)
WL side wall
CW claw (engagement portion)
BZ1 front bezel (housing)
WL1 outer side-wall (side wall)
CW1 outer claw (engagement portion)
35 protrusion (engagement portion)
BZ2 rear bezel (housing)
WL2 inner side-wall (side wall)
CW2 inner claw (engagement portion)
SU stand-up portion (engagement portion)
36 recess (engagement portion)
CS built-in chassis (housing)
WL3 thick side-wall (side wall)
BG bulge (engagement portion)
1 FPC board (circuit board)
11 supply conductor
11M control supply conductor (main supply conductor)
11MG group of control supply conductors (group of main supply conductors)
11S check supply conductor (sub supply conductor)
11SG group of check supply conductors (group of sub supply conductors)
12 ground portion
41 liquid crystal display panel (display panel)
42 active-matrix substrate
43 counter substrate
46 driver (control element)
47 diver conductor (element conductor)

47M control driver conductor (main element conductor)
47MG group of control driver conductors (group of main element conductors)
47S check driver conductor (sub element conductor)
47SG check driver conductor group (group of sub element conductors)
49 liquid crystal display panel unit
MJ LED module
51 mounting substrate
52 LED
54 light guide plate
55 reflection sheet
59 backlight unit
69 liquid crystal display device (display)
BR bend line
P alignment direction
Q stacking direction
R crossing direction (extension direction of bend line)

BEST MODE FOR CARRYING OUT THE INVENTION

[Embodiment 1]

Hereinafter, an embodiment of the present invention will be described with reference to the drawings. Hatching, reference signs for members, and the like may sometimes be omitted in a drawing for ease of description, and in such a case, a different drawing is to be referred to. Reversely, views other than sectional views may be shown with hatching for the sake of convenience. A black dot in a drawing indicates a direction perpendicular to the sheet on which the drawing is drawn.

The following description will deal with a liquid crystal display device as an example of a display, but this is not meant to limit the present invention. For example, the display may be an organic EL (electro-luminescence) display device or a plasma display device. In the liquid crystal display device, various kinds of fixing tapes are used, but they will be omitted in the descriptions for the sake of convenience.

Figure 2:
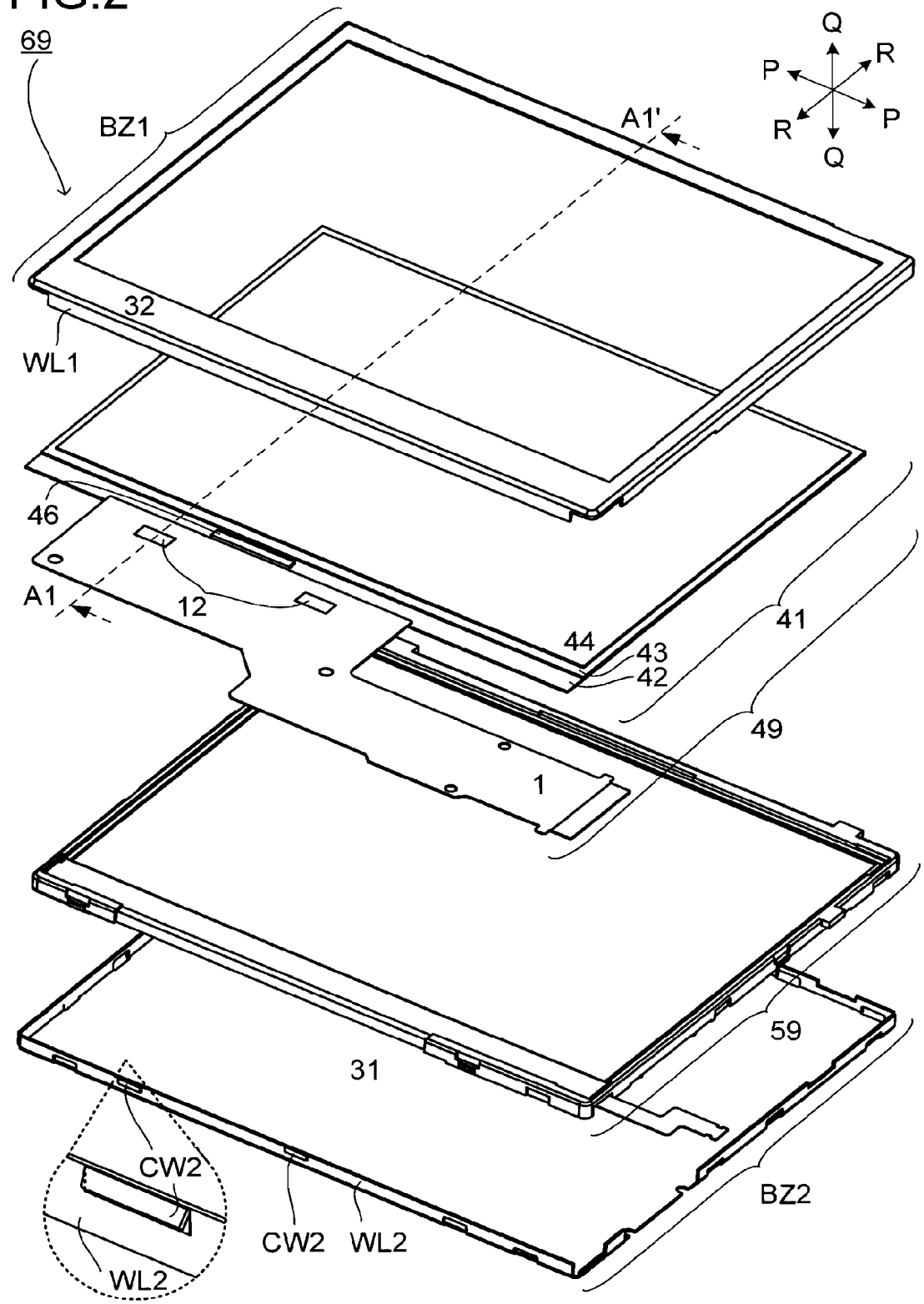
[FIG. 2] is an exploded perspective view of a liquid crystal display device.
Figure 3:
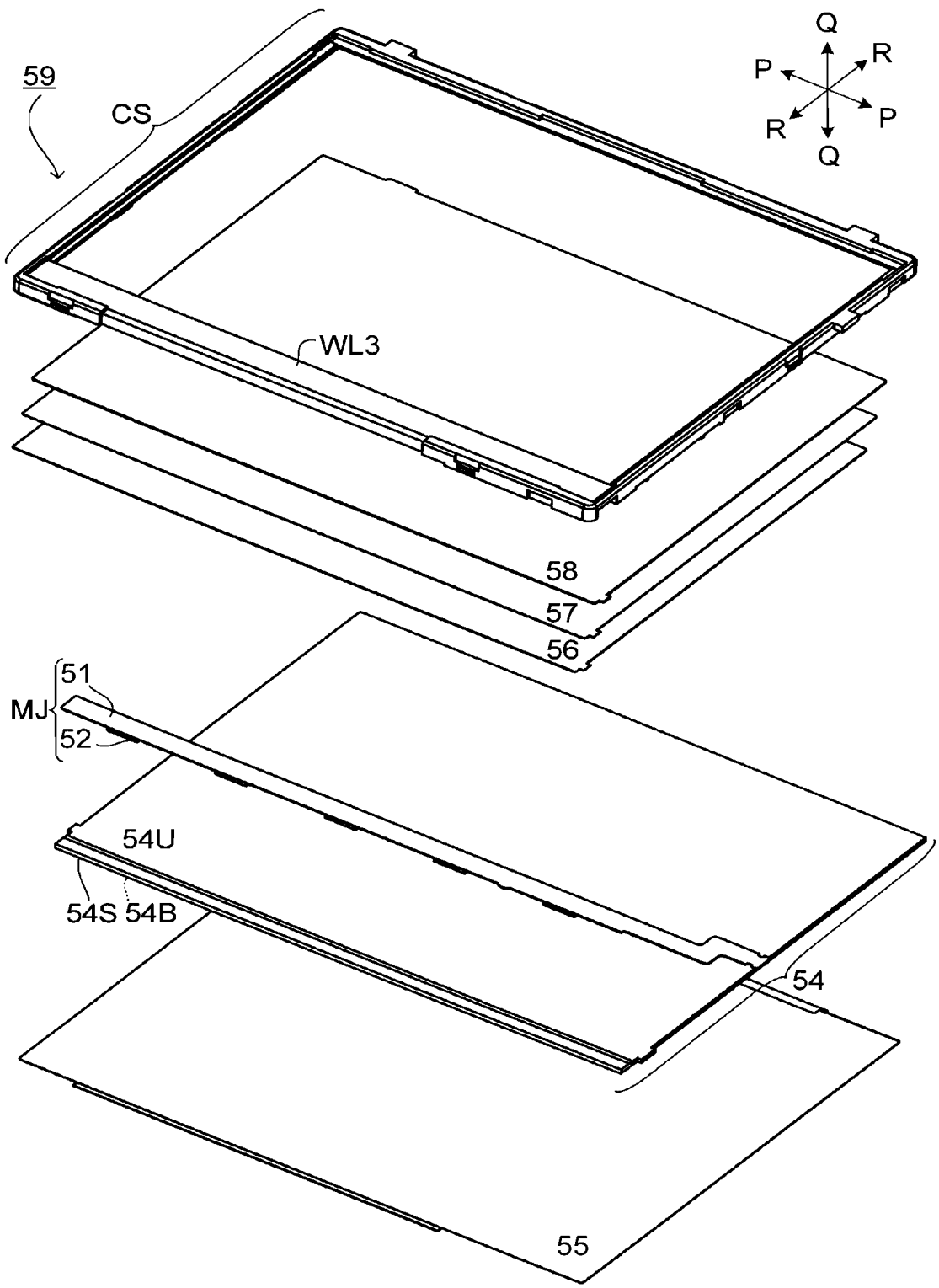
[FIG. 3] is an exploded perspective view of a backlight unit incorporated in the liquid crystal display device shown in FIG. 2.

The sectional view of FIG. 1 and the exploded perspective view of FIG. 2 show a liquid crystal display device 69 (here, the sectional view of FIG. 1 is taken along line A1-A1' and seen from the direction indicated by arrows in FIG. 2). FIG. 3 is an exploded perspective view of a backlight unit 59 included in the liquid crystal display device 69.

As shown in FIGS. 1 and 2, the liquid crystal display device 69 includes a liquid crystal display panel unit 49, the backlight unit 59, and a bezel BZ (front bezel BZ1 and rear bezel BZ2) having the two units 49 and 59 interposed therein to thereby hold them.

A shape of the bezel BZ is not limited to a particular shape. For example, as shown in FIG. 2, the bezel BZ may be formed such that the rear bezel BZ2 is a box-shaped member in which the units 49 and 59 are housed, and the front bezel BZ1 is a frame-shaped member that covers the rear bezel BZ2 (here, the bezels BZ1 and BZ2 can be referred to as housings, since they hold members).

The liquid crystal display panel unit 49 includes a liquid crystal display panel (a display panel) 41 and an FPC (flexible printed circuits) board 1.

The liquid crystal display panel 41 is formed by adhering: an active matrix substrate 42 including a switching device such as a TFT (thin film transistor); and a counter substrate 43 that faces the active matrix substrate 42, to each other with a seal member (not shown). Liquid crystal (not shown) is charged in a space between the substrates 42 and 43 (here, polarization films 44 and 44 are attached so as to hold the active matrix substrate 42 and the counter substrate 43 therebetween).

The FPC board (circuit board) 1 is a substrate that includes supply conductors 11 (see, for example, FIG. 11, which will be described later) that carry an electric current from an unillustrated power supply, and that are connected to the liquid crystal display panel 41. The supply conductors 11 of the FPC board 1 are connected, for example, to a driver (a control element) 46 that controls display on the liquid crystal display panel 41.

Specifically, the driver 46 is disposed, on the active matrix substrate 42, close to an edge of the active matrix substrate 42 and along the FPC board 1, and driver conductors 47 included in the driver 46 are connected to the supply conductors 11 of the FPC board 1 (see, for example, FIG. 11 which will be described later). Incidentally, part of the active matrix substrate in the vicinity of an edge thereof where the driver 46 is disposed is part of a surface of the active matrix substrate 42 that faces the counter substrate 43, and the part is not covered with the counter substrate 43.

Figure 4:
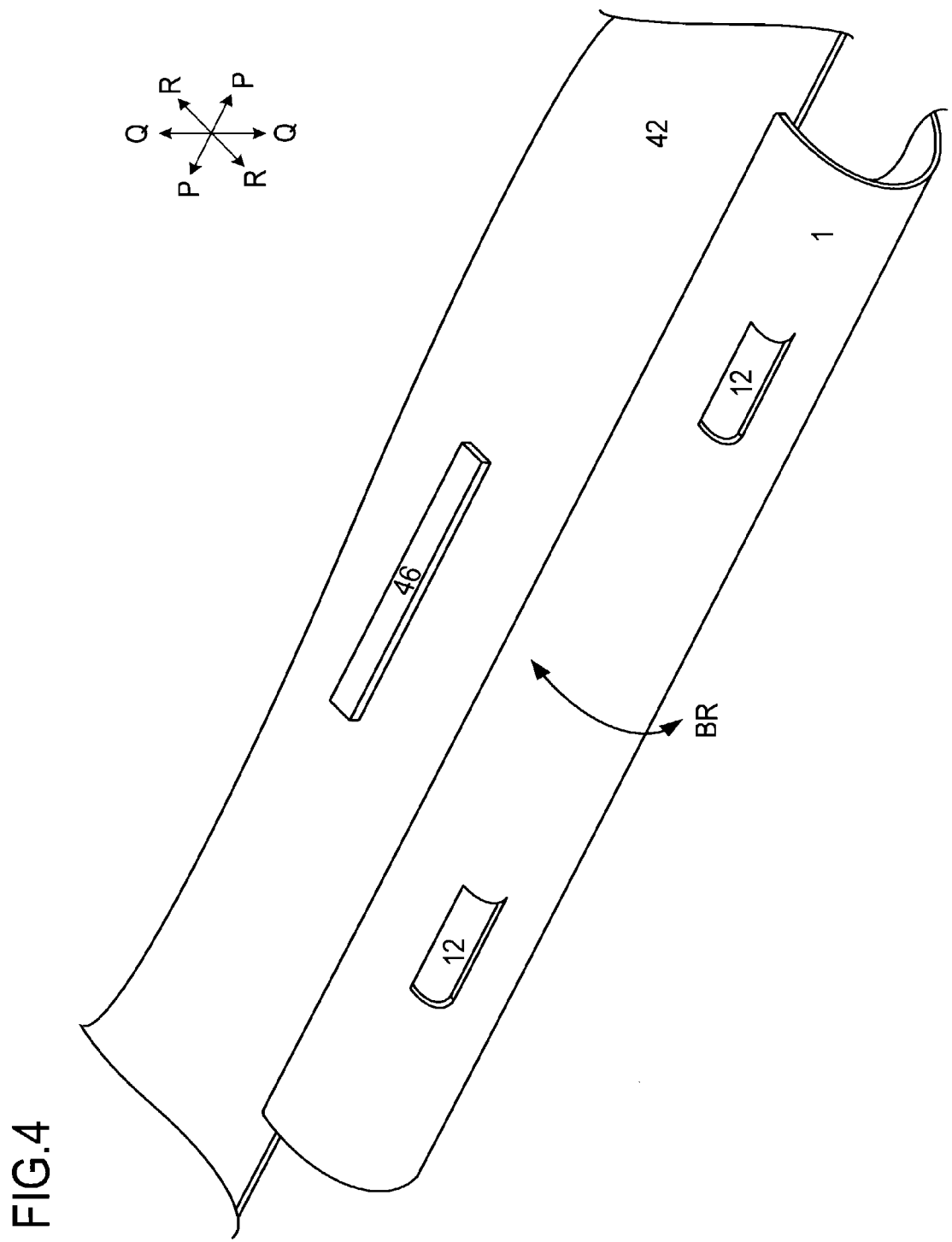
[FIG. 4] is an enlarged perspective view of an FPC board.

The FPC board 1 is a substrate having flexibility, and, for example, can be curved (bent) as shown in FIG. 4. Thus, hereinafter, a line along the shape of the FPC board 1 that bends will be referred to as a bend line BR.

As a countermeasure against static electricity, the FPC board 1 includes an electrically conductive ground portion 12. Specifically, a protection film (not shown) that covers front and rear surfaces of the FPC board 1 does not cover the ground portion 12, so that the ground portion 12 is exposed, and the ground portion 12 itself is film-shaped.

The back light unit 59 irradiates light onto the liquid crystal display panel 41, which does not emit light by itself. That is, the liquid crystal display panel 41 exerts its display function by receiving light (backlight light) from the backlight unit 59. Thus, the display quality of the liquid crystal display panel 41 will be improved by uniform irradiation of the entire surface of the liquid crystal display panel 41 with the light from the backlight unit 59.

And, such a backlight unit 59 includes, as shown in FIG. 3, an LED module MJ, a light guide plate 54, a reflection sheet 55, a diffusion sheet 56, optical sheets 57 and 58, and a built-in chassis CS.

The LED module MJ is a light emitting module, including: a mounting substrate 51; and LEDs (light emitting diodes) 52 that emit light by being supplied with electric current via electrodes that are formed on a mounting surface of the mounting substrate 11 and on which they are mounted.

It is preferable that the LED module MJ include a plurality of LEDs (light emitting blocks; point light sources) 52, and furthermore, it is preferable that the LEDs 52 are aligned parallel to each other in a row. However, merely some of the LEDs 52 are shown in the figure for ease of illustration (incidentally, the direction along which the LEDs 52 are aligned will be referred to as an alignment direction P).

The light guide plate 54 is a plate-like member that has side surfaces 54S and top and bottom surfaces 54U and 54B that are positioned so as to hold the side surfaces 54S therebetween. One surface (a light receiving surface) of the side surfaces 54S faces light emitting surfaces of the LEDs 52, to thereby receive light from the LEDs 52. The received light is subjected to mixing inside the light guide plate 54 to be emitted to the outside from the top surface 54U as surface light.

The reflection sheet 55 is located so as to be covered with the light guide plate 54. One surface of the reflection sheet 42 that faces the bottom surface 54B of the light guide plate 54 functions as a reflection surface. Thus, this reflection surface reflects light from the LEDs 52 and light transmitting inside the light guide plate 54 back to the light guide plate 54 (specifically, through the bottom surface 54B of the light guide plate 54) without leakage of light.

The diffusion sheet 56 is placed so as to cover the top surface 54U of the light guide plate 54, and diffuses surface light coming from the light guide plate 54 to deliver the light to the entirety of the liquid crystal display panel 41 (incidentally, the diffusion sheet 56 and the optical sheets 57 and 58 are together referred to as an optical sheet group as well).

The optical sheets 57 and 58 are each an optical sheet having, for example, a prism shape within a sheet so as to deflect the radiation characteristic of light, and they are placed so as to cover the diffusion sheet 56. Thus, the optical sheets 57 and 58 collect light coming from the diffusion sheet 56, to thereby increase brightness. Incidentally, the optical sheets 57 and 58 are disposed so as to output light they collect in directions that cross each other.

The built-in chassis CS is a picture-frame shaped basic substance (a frame) for holding the variety of members described above (the built-in chassis CS can be referred to as housing, since it holds members). Specifically, the built-in chassis CS holds the reflection sheet 55, the light guide plate 54, the diffusion sheet 56, and the optical sheets 57 and 58, which are stacked one on top of another in this order {incidentally, the direction in which they are stacked will be referred to as stacking direction Q, and a direction that is perpendicular to (crossing) the alignment direction P and the stacking direction Q will be referred to as crossing direction R}.

In the backlight unit 59 described above, light from the LEDs 52 enters the light guide plate 54 to be emitted therefrom as surface light, and the thus emitted surface light passes through the optical sheet group, to be thereby emitted as backlight light having enhanced brightness. The thus generated backlight light reaches the liquid crystal display panel 41, on which an image is displayed by using the backlight light.

Here, a description will be given how the ground portion 12 of the FPC substrate 1 secure electric conductivity (that is, the connection structure between the ground portion 12 and a conductive portion). First, description will be given of the rear bezel BZ2 and the front bezel BZ1, which are conductive portions with which the ground portion 12 is in contact.

The rear bezel BZ2 and the front bezel BZ1 are both formed of electrically conductive material (however, this is not meant as a limitation, and it is sufficient if at least one of them is formed of electrically conductive material).

The rear bezel BZ2 is a box-shaped member having a bottom surface 31 and side walls WL (inner side-walls WL2) that stand up from edges of the bottom surface 31. The backlight unit 59 is housed within the rear bezel BZ2. On the other hand, the front bezel BZ1 is a frame-shaped member having a frame surface 32 and side walls WL (outer side-walls WL1) that stand up from outer edges of the frame surface 32. The front bezel BZ1 covers the rear bezel BZ2 like a lid.

Thus, a contour of the front bezel BZ1 is slightly larger than a contour of the rear bezel BZ2 (incidentally, the contours here are a loop formed by connecting the side-walls WL1 of the bezel BZ1 and a loop formed by connecting the side-walls WL2 of the bezel BZ2). Thus, when the front bezel BZ1 is put in place as the lid with respect to the rear bezel BZ2, inside of the outer side-walls WL1 and outside of the inner side-walls WL2 face each other.

And, the bezels BZ1 and BZ2 are engaged with each other to together hold the liquid crystal display panel unit 49 and the backlight unit 59 therebetween (that is, the bezels BZ1 and BZ2 are united, holding the units 49 and 59 therebetween).

To achieve the engagement, claws CW (CW1 and CW2) are formed in the front bezel BZ1 and the rear bezel BZ2, respectively. That is, of the claws (engagement portions) CW1 and CW2 that unite the front and rear bezels BZ1 and BZ2 by engaging with each other, the claw (outer claw) CW1 is included in the front bezel BZ1, and the claw (inner claw) CW2 is included in the rear bezel BZ2 (incidentally, the united front and rear bezels BZ1 and BZ2 can be called a housing unit).

The outer claw CW1 is formed as a "[" shaped cut in an outer side-wall WL1, and the inner claw CW2 is formed as a "[" shaped cut in an inner side-wall WL2.

Specifically, as shown in FIG. 1, starting and ending ends of a cut is positioned at a side of an edge of an outer side-wall WL1, and the cut portion is raised inward from the outer side-wall WL1, whereby an outer claw CW1 is accomplished. As shown in FIGS. 1 and 2, starting and ending ends of a cut is positioned at a side of an edge of an inner side-wall WL2, and the cut portion is raised outward from the inner side-wall WL2, whereby is accomplished the inner claw CW2, which is to be engaged with the outer claw CW1.

With this structure, when the front bezel BZ1 is put in place as a lid with respect to the rear bezel BZ2, the outer claw CW1, which is positioned inside the outer side-wall WL1, and the inner claw CW2, which is positioned outside the inner side-wall WL2, face, and engage with, each other.

The bezels BZ1 and BZ2, which are united by the above-described engagement between the claws CW1 and CW2, hold the backlight unit 59 and the liquid crystal display panel unit 49, for example, in the following manner.

That is, first the backlight unit 59 is housed within the rear bezel BZ2, and the liquid crystal display panel unit 49 is placed on the built-in chassis CS of the backlight unit 59 (specifically, the built-in chassis CS supports one surface of the active matrix substrate 42 that is the farthest from the counter substrate 43).

The FPC board 1 included in the liquid crystal display panel unit 49, as shown in FIG. 1, is bent such that it covers the outer side of the inner side-wall WL2, and further, such that it covers the bottom surface 31 of the rear bezel BZ2 as well. That is, the FPC board 1 winds around the rear bezel BZ2 such that it covers the inner side-wall WL2 and the bottom surface 31.

In this flexible FPC board 1, the ground portion 12 is located at a position that faces the inner claw CW2 of the inner side-wall WL2. With this structure, when the front bezel BZ1 is placed to cover the rear bezel BZ2, the outer claw CW1 faces the inner claw CW2 with the ground portion 12 therebetween.

As a result, the outer claw CW1 is engaged with the inner claw CW2 with the ground portion 12 therebetween. That is, in the front and rear bezels BZ1 and BZ2 (also called "electronic package") within which the FPC board 1 is to be disposed, the outer claw CW1 of the front bezel BZ1 and the inner claw CW2 of the rear bezel BZ2 are engaged with each other, holding the ground portion 12 of the FPC board 1 therebetween.

The outer and inner claws CW1 and CW2 are formed of electrically conductive material corresponding to the material of the front and rear bezels BZ1 and BZ2, respectively. This makes static electricity flow via the ground portion 12 to the outer and inner claws CW1 and CW2 (and thus, to the front and rear bezels BZ1 and BZ2). This prevents various malfunctions from being caused by static electricity.

Furthermore, the outer and inner claws CW1 and CW2 are arranged to hold the ground portion 12 therebetween, that is, not avoiding the FPC board 1. Thus, it is not that the outer claw CW1 is located only on an outer a side-wall WL1 that does not face the FPC board 1, and it is not that the inner claw CW2 is located only on an inner side-wall WL2 that does not face the FPC board 1.

Thus, the outer and inner claws CW1 and CW2 may be located anywhere on the outer side-walls WL1 and the inner side-walls WL2 without being restricted by the FPC board 1 as long as they are located in a positional relationship that allows them to engage with each other (in short, positions of the claws CL are set with increased freedom).

For example, claws CW (CW1 and CW2) may be arranged on side walls WL (WL1 and WL2) that face each other along the short-side direction of the bezel BZ (BZ1 and BZ2) such that they face each other along the short-side direction. Claws CW (CW1 and CW2) may of course be arranged on side walls WL (WL1 and WL2) that face each other along the long-side direction of the bezel BZ (BZ1 and BZ2) such that they face each other along the long-side direction.

With this structure, since the engagement positions of the front bezel BZ1 face the engagement positions of the rear bezel BZ2 along each direction (along the long-side and short-side directions of the bezel BZ), the engagement force is appropriately applied to both of the front and rear bezels BZ1 and BZ2, allowing the front bezel BZ1 and the rear bezel BZ2 to be firmly united.

Claws CW (CW1 and CW2) may be located in the middles of the side walls WL (WL1 and WL2) along the long-side direction. Even with such an arrangement, the engagement force is appropriately applied to both of the bezels BZ1 and BZ2, allowing the front bezel BZ1 and the rear bezel BZ2 to be firmly united.

As shown in FIG. 1, a side toward which the outer claw CW1 extends corresponds to a side toward which the front bezel BZ1 tends to move to separate from the rear bezel BZ2, and a side toward which the inner claw CW2 extends correspond to a side toward which the rear bezel BZ2 tends to move to separate from the front bezel 1. Specifically, the outer claw CW1 extends toward the same side toward which the front bezel BZ1 tends to move to separate from the rear bezel BZ2, and the inner claw CW2 extends toward the same side toward which the rear bezel BZ2 tends to move to separated from the front bezel BZ1.

With this structure, the more the front and rear bezels BZ1 and BZ2 tend to move in the directions apart from each other, the more firmly the outer and inner claws CW1 and CW2 are interlocked with each other (hooked together). Thus, the degree of engagement between the front and rear bezels BZ1 and BZ2 (the strength thereof as a housing unit) is further increased.

Furthermore, since both the outer and inner claws CW1 and CW2 project, the ground portion 12 and the outer claw CW1 are in secure contact with each other, and so are the ground portion 12 and the inner claw CW2 (specifically, the outer claw CW1 is in a contact with one of the two sides of the film-shaped ground portion 12 such that the outer claw CW1 sinks into the one of the two sides of the film-shaped ground portion 12), and the inner claw CW2 is in contact with the other one of the two sides of the film-shaped ground portion 12 such that the inner claw CW2 sinks into the other one of the two sides of the film-shaped ground portion 12). This enables static electricity to securely flow to the bezel BZ.

Moreover, an outer claw CW1 is formed by raising a cut portion formed in an outer side-wall WL1 of the front bezel BZ1, and an inner claw CW2 is formed by raising a cut portion formed in an inner side-wall WL2 of the rear bezel BZ2. As a result, the electrically conductive material itself, of which the front bezel BZ1 is formed, is exposed at peripheral edges of an outer claw CW1, and the electrically conductive material itself, of which the rear bezel BZ2 is formed, is exposed at peripheral edges of an inner claw CW2.

Thus, even if a conductivity-impairing coating is applied to the front and rear bezels BZ1 and BZ2, as long as the front and rear bezels BZ1 and BZ2 are formed of electrically conductive material, the peripheral edges of the outer and inner claws CW1 and CW2 are electrically conductive. Thus, static electricity securely flows, via the peripheral edges of the inner claws CW1 and CW2, to the front and rear bezels BZ1 and BZ2.

Figure 5:
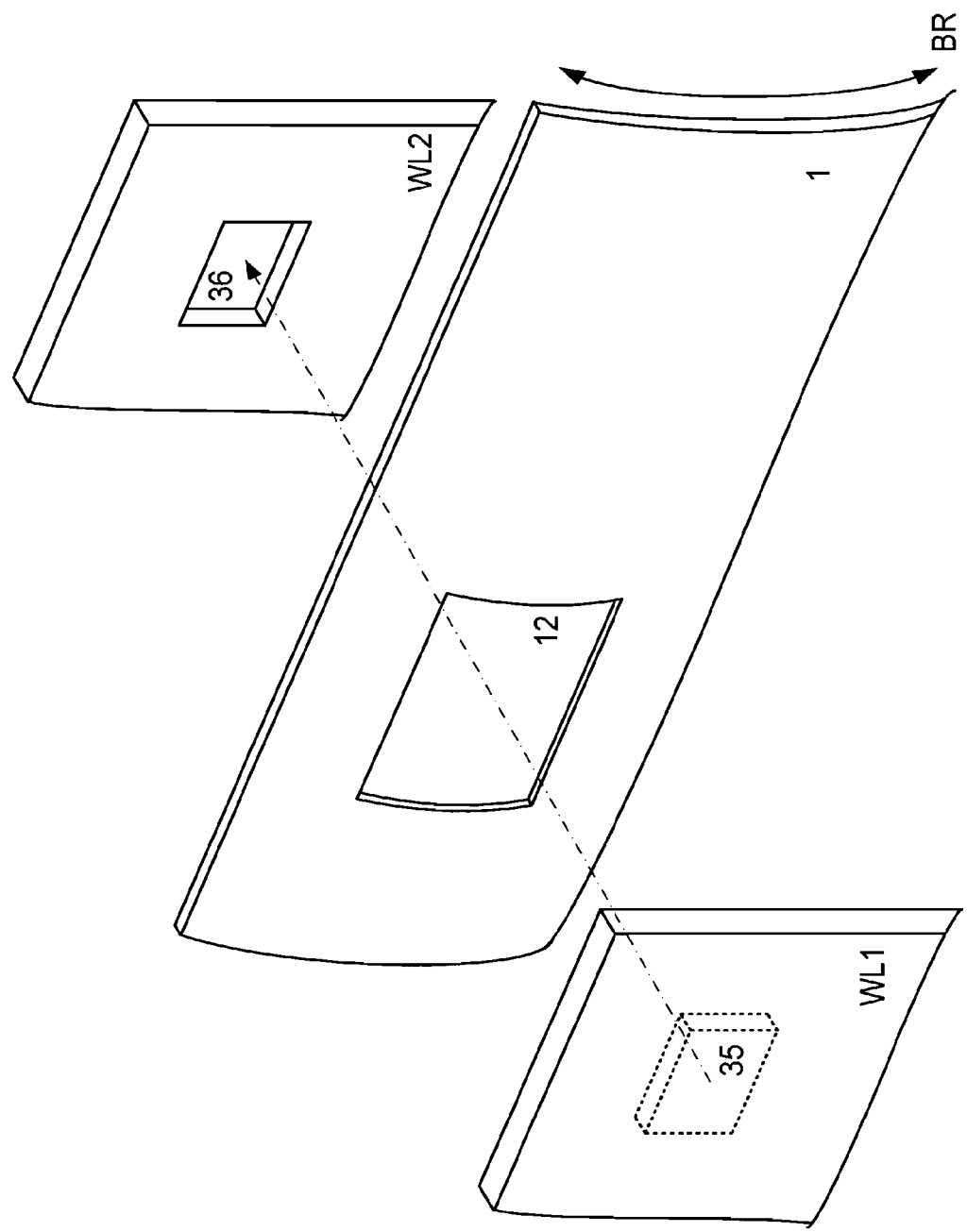
[FIG. 5] is a perspective view extracting and showing an outer side-wall of a front bezel, an FPC board, and an inner side-wall of a rear bezel.

The shapes of the claws CW are not limited to those described above, and the claws CW may be shaped otherwise. For example, as shown in FIG. 5, which is a perspective view extracting and showing an outer side-wall WL1, the FPC board 1, and an inner side-wall WL2, a protrusion 35 protruding from the inner side of the outer side-wall WL1 and a recess 36 recessed from the outer side of the inner side-wall WL2 may be used as the engagement portions. That is, the protrusion 35 and the recess 36 may be engaged with each other via a film-shaped ground portion 12.

With this structure as well, the protrusion 35 and the recess 36 are comparatively firmly engaged with each other with the ground portion 12 interposed therebetween, and static electricity flows to the bezel BZ. Furthermore, thickness of a thickness part (a frame part) formed of the outer and inner side-walls WL1 and WL2 fitted together is reduced by an amount corresponding to the thickness of the protrusion 35, which is fitted into the recess 36, and as a result, the frame of the backlight unit 59 can be made narrow.

[Embodiment 2]

Embodiment 2 will be described. Such members as function similarly to their counterparts in the first embodiment are identified by common reference signs and no description of them will be repeated.

In Embodiment 1, the backlight unit 59 is first housed within the rear bezel BZ2, and the liquid crystal display panel unit 49 is placed so as to cover the built-in chassis CS of the backlight unit 59. The FPC board 1 is bent such that it covers the outer side of an inner side-wall WL2, and the FPC board 1 is further bent so as to cover the bottom surface 31 of the rear bezel BZ2 as well. However, this is not meant as a limitation.

Figure 6:
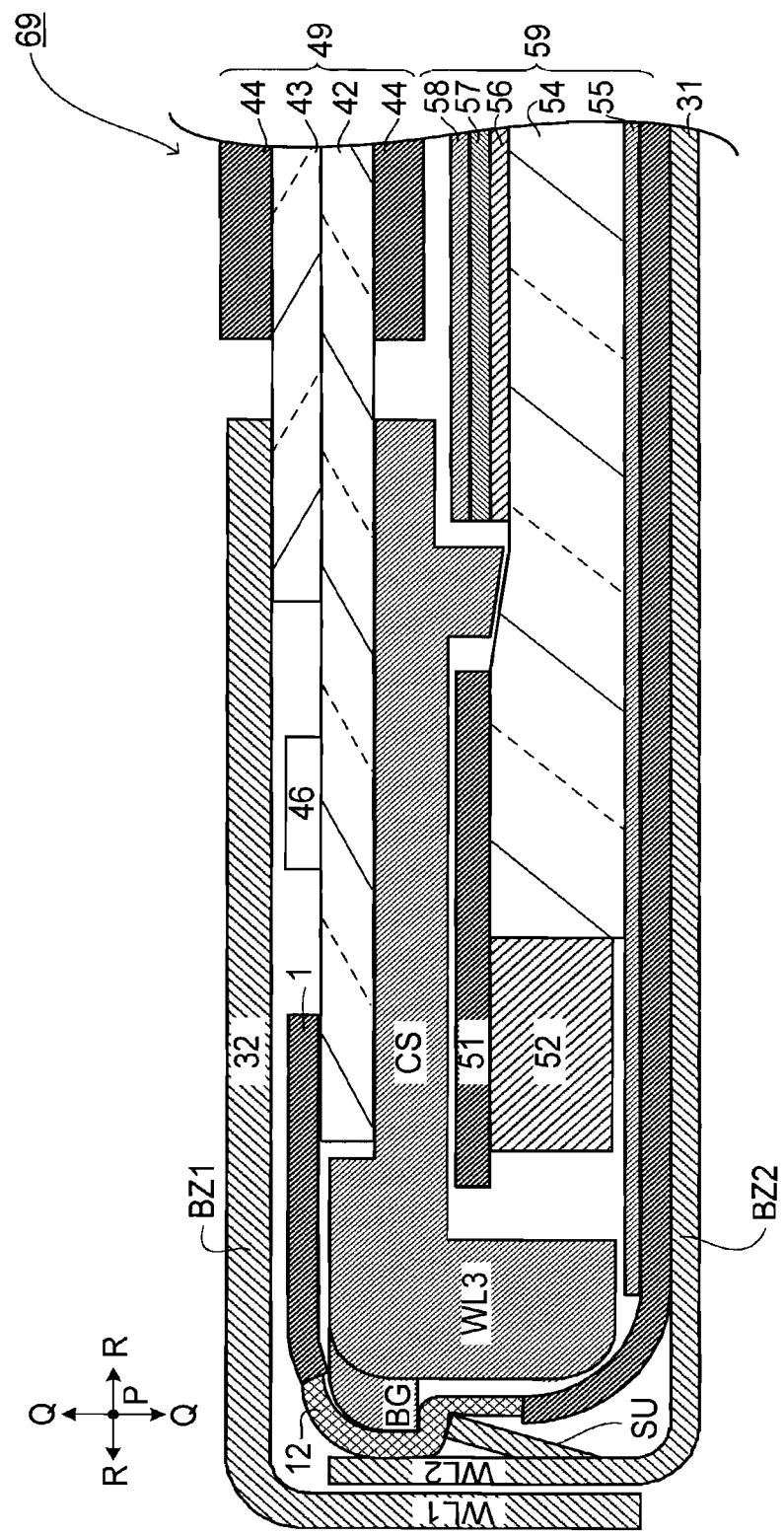
[FIG. 6] is a sectional view of a liquid crystal display device taken along line A2-A2' of FIG. 7, and viewed from the direction indicated by arrows shown in FIG. 7.

For example, the following is possible: the liquid crystal display panel unit 49 is first placed to cover the built-in chassis CS of the backlight unit 59, the FPC board 1 is bent such that it covers the outer side of a thick side-wall WL (a thick side-wall WL3) of the built-in chassis CS, and the FPC board 1 is further bent so as to cover the reflection sheet 55 as well (that is, the FPC board 1 winds around and covers the thick side-wall WL3 of the built-in chassis CS and the reflection sheet 5; see the sectional view of FIG. 6 which will be described later).

In this case, where the backlight unit 59 and the liquid crystal display panel unit 49 are housed in the rear bezel BZ2 with the FPC board 1 bent, and thereafter a front bezel BZ1 is placed to cover the rear bezel BZ2, the FPC board 1 is not held between an outer side-wall WL1 of the front bezel BZ1 and an inner side-wall WL2 of the rear bezel BZ2. Thus, the connection structure between the ground portion 12 and the conductive portion is different from that of Embodiment 1.

Figure 7:
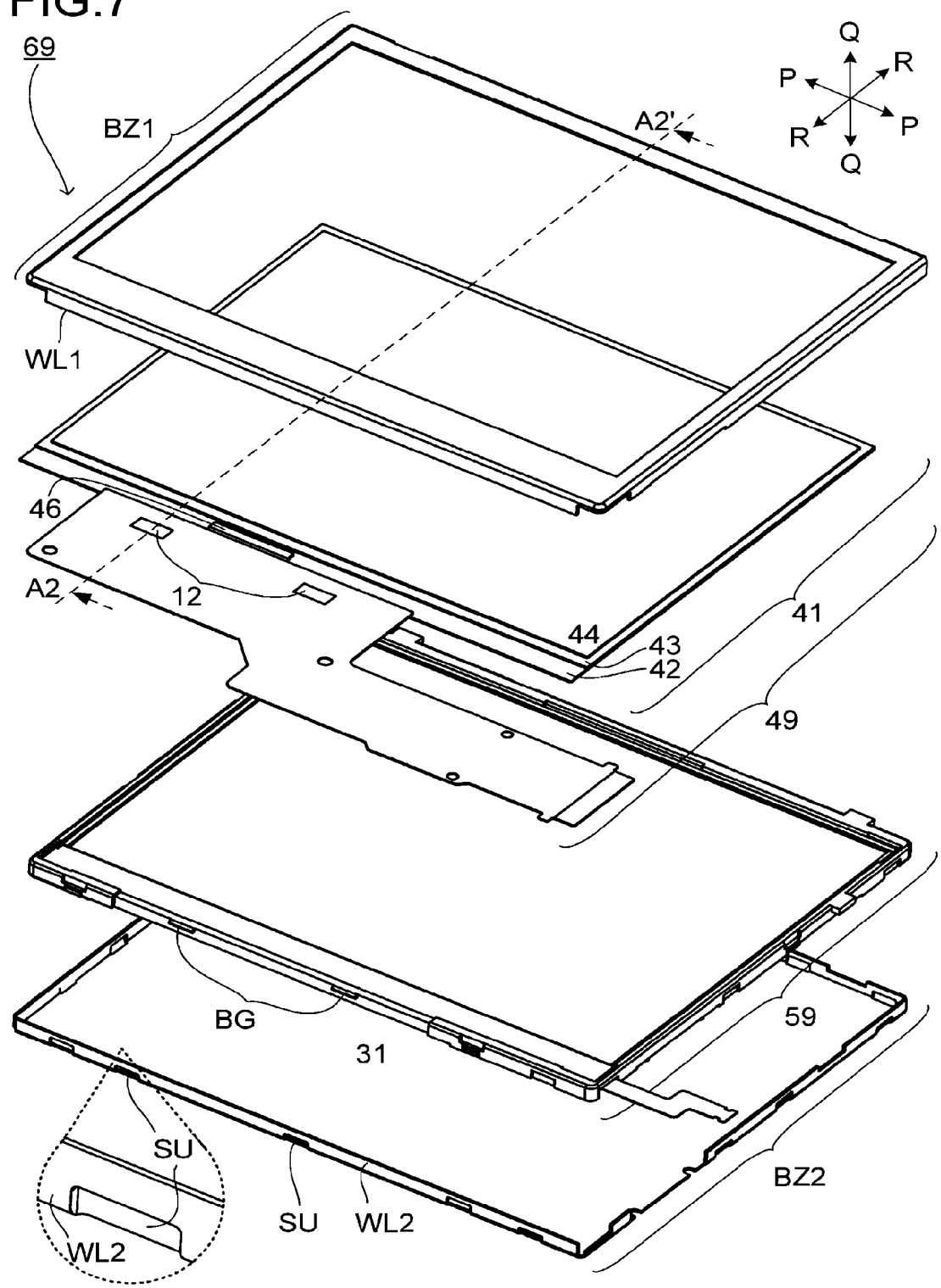
[FIG. 7] is an exploded perspective view of a liquid crystal display device different from the liquid crystal display device shown in FIG. 2.
Figure 8:
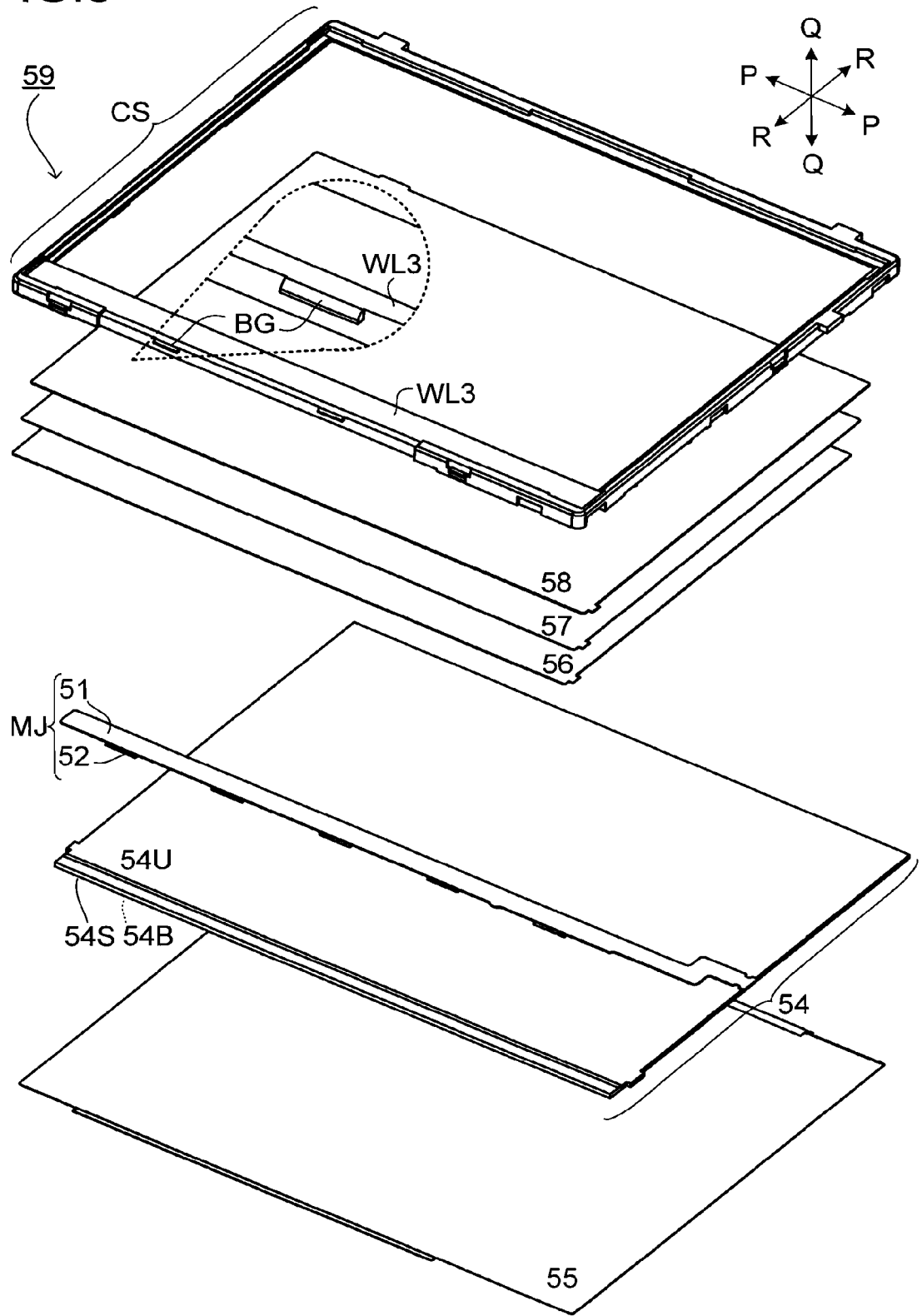
[FIG. 8] is an exploded perspective view of a backlight unit included in the liquid crystal display device shown in FIG. 7.

Thus, with respect to Embodiment 2, descriptions will be given of the connection structure between the ground portion 12 and the conductive portion, which is different from that of Embodiment 1, with reference to FIGS. 6 to 8. The sectional view of FIG. 6 and the exploded perspective view of FIG. 7 show the liquid crystal display device 69 (here, the sectional view of FIG. 6 is taken along line A2-A2' and seen from the direction indicated by arrows indicated in FIG. 7). FIG. 8 is an exploded perspective view of the backlight unit 59 included in the liquid crystal display device 69.

As shown in FIG. 6, an FPC board 1 is bent such that it covers the outer side of a thick side-wall WL3 of a built-in chassis CS, and it is further bent to cover a reflection sheet 55. Thus, when a backlight unit 59 and a liquid crystal display panel unit 49 are housed within a rear bezel BZ2, an inner side-wall WL2 of a rear bezel BZ2 and the thick side-wall WL3 hold the FPC board 1 therebetween (that is, the inner side-wall WL2 and the thick side-wall WL3 face each other).

Thus, it is preferable that the ground portion 12 of the FPC board 1 be held by and between the inner side-wall WL2 of the rear bezel BZ2 and the thick side-wall WL3 of the built-in chassis CS. To achieve this, the ground portion 12 is located at positions that face the thick side-wall WL3 when the liquid crystal display panel unit 49 is supported by the built-in chassis CS (incidentally, at least either the rear bezel BZ2 or the built-in chassis CS is formed of electrically conductive material; however, in Embodiment 2, it is assumed that only the rear bezel BZ2 is formed of electrically conductive material).

Furthermore, for the rear bezel BZ2 and the built-in chassis CS to engage with each other with the ground portion 12 interposed therebetween, engagement portions (a stand-up portion SU and a bulge BG) are formed in the rear bezel BZ2 and the built-in chassis CS, respectively, such that they engage with each other (here, the united front and rear bezels BZ1 and BZ2 can be called a housing unit). Specifically, the standing portion SU is formed on the inner side of the inner side-wall WL2 of the rear bezel BZ2, and the bulge BG is formed on the outer side of the thick side-wall WL3 of the built-in chassis CS.

With this structure, when the backlight unit 59, with the thick side-wall WL3 and the reflection sheet 55 covered with the FPC board 1 that bends, is housed within the rear bezel BZ2, the bulge BG of the built-in chassis CS faces the stand-up portion of the rear bezel BZ2 holding the ground portion 12 therebetween.

As a result, the bulge BG is engaged with the stand-up portion SU holding the ground portion 12 therebetween. That is, with the rear bezel BZ2 within which the FPC board 1 is to be placed and the built-in chassis CS (which are together called "electronic package" as well), the stand-up portion SU of the rear bezel BZ2 and the bulge BG of the built-in chassis CS engage with each other, holding the ground portion 12 therebetween.

The stand-up portion SU is formed of electrically conductive material corresponding to the material of the rear bezel BZ2, and thus static electricity flows via the ground portion 12 to the stand-up portion SU (and thus to the rear bezel BZ2). This prevents various malfunctions due to static electricity. The built-in chassis CS, and thus the backlight unit 59, are stationary with respect to the rear bezel BZ2, and stably housed within the rear bezel BZ2.

Furthermore, the stand-up portion SU and the bulge BG are arranged to hold the ground portion 12 therebetween, that is, not avoiding the FPC board 1. It is not that the stand-up portion SU is located only on an inner side-wall WL2 that does not face the FPC board 1, and it is not that the bulge BG is located only on a thick side-wall WL3 that does not face the FPC board 1.

Thus, the stand-up portion SU and the bulge BG may be located anywhere on the inner side-walls WL2 and the thick side-walls WL3 as long as they are located in a positional relationship that allows them to engage with each other (in short, positions of the stand-up portion SU and the bulge BG are set with increased freedom).

For example, stand-up portions SU may be arranged on inner side-walls WL2 that face each other along the short-side direction of the rear bezel BZ2, such that the stand-up portions SU face each other along the short-side direction of the rear bezel BZ2 (and accordingly, bulges BG are arranged on thick side-walls WL3 that face each other along the short-side direction of the built-in chassis CS, such that the bulges BG face each other along the short-side direction of the built-in chassis CS).

It goes without saying that stand-up portions SU may be arranged on inner side-walls WL2 that face each other along the long-side direction of the rear bezel BZ2 such that the stand-up portions SU face each other along the long-side direction of the rear bezel BZ2 (and accordingly, bulges BG are arranged on thick side-walls WL3 that face each other along the long-side direction of the built-in chassis CS, such that the bulges BG face each other along the long-side direction of the built-in chassis CS).

With this structure, since engagement positions of the rear bezel BZ1 face engagement positions of the built-in chassis CS along each direction (along the long-side and short-side directions of the rear bezel BZ2), the rear bezel BZ2 and the built-in chassis CS are firmly united.

Incidentally, it is preferable that, as shown in FIGS. 6 and 7, a stand-up portion SU be accomplished by raising a bracket-shaped ("[" shaped) cut, which is formed in an inner side-wall WL2 (that is, the bezel BZ), inward from the inner side-wall WL2, with the starting and ending ends of the bracket-shaped cut located at the base side of the inner side-wall WL2. This is not meant as a limitation, however, and a stand-up portion SU may have a different shape (for example, it may be shaped like the bulge BG).

On the other hand, it is preferable that, as shown in FIGS. 6 and 8, the bulge BG, which is to be engaged with the stand-up portion SU, be formed by partly protruding outer side of a thick side-wall WL3. This is not meant as a limitation, however, and the bulge BG may have a different shape (for example, it may be shaped like the stand-up portion SU).

[Embodiment 3]

Embodiment 3 will be described. Such members as function similarly to their counterparts in the first and second embodiments are identified by common reference signs and no description of them will be repeated. In particular, a backlight unit 59 of Embodiment 3 is equivalent to the backlight unit 59 shown in FIG. 8, and thus illustration thereof is omitted.

The shape of the ground portion 12 of the FPC board 1 is not limited to the shapes that are employed in Embodiments 1 and 2, and various shapes are possible as the shape of the ground portion 12. For example, as shown in the perspective view of FIG. 10, the ground portion 12 may be such that it is exposed out of a protection film (not shown) of the FPC board 1 to stand up from the board face of the FPC board 1.

Specifically, a thin portion formed by raising a cut portion formed in the FPC board 1 may be the ground portion 12 (it can also be said that the ground portion 12 is a portion which is cut to form a hole HL in the FPC board 1, the ground portion 12 being a thin portion bent upward from the board surface while remaining connected to the FPC board 1).

Figure 9:
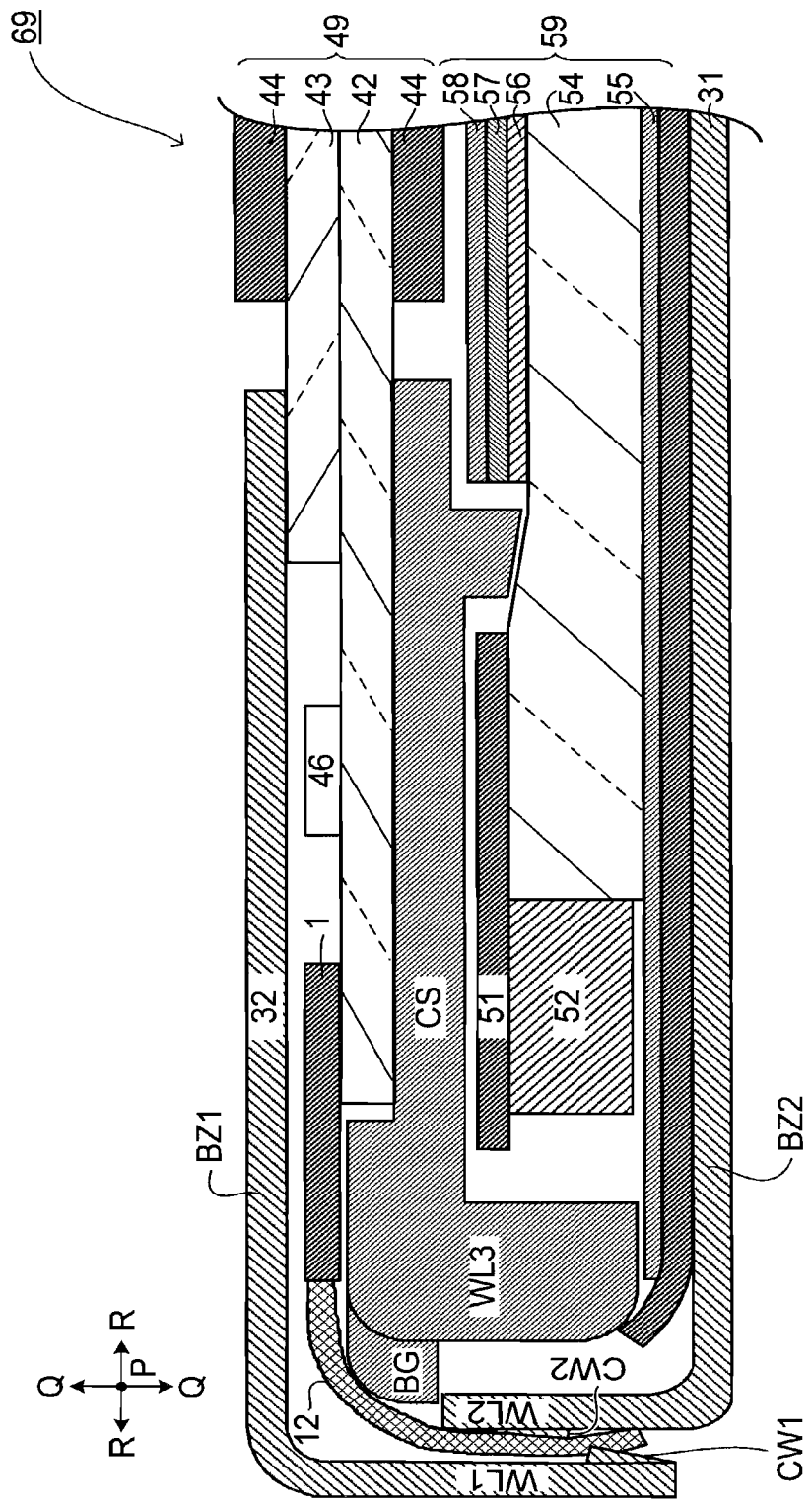
[FIG. 9] is a sectional view of a liquid crystal display device taken along line A3-A3' of FIG. 10, and viewed from the direction indicated by arrows shown in FIG. 10.
Figure 10:
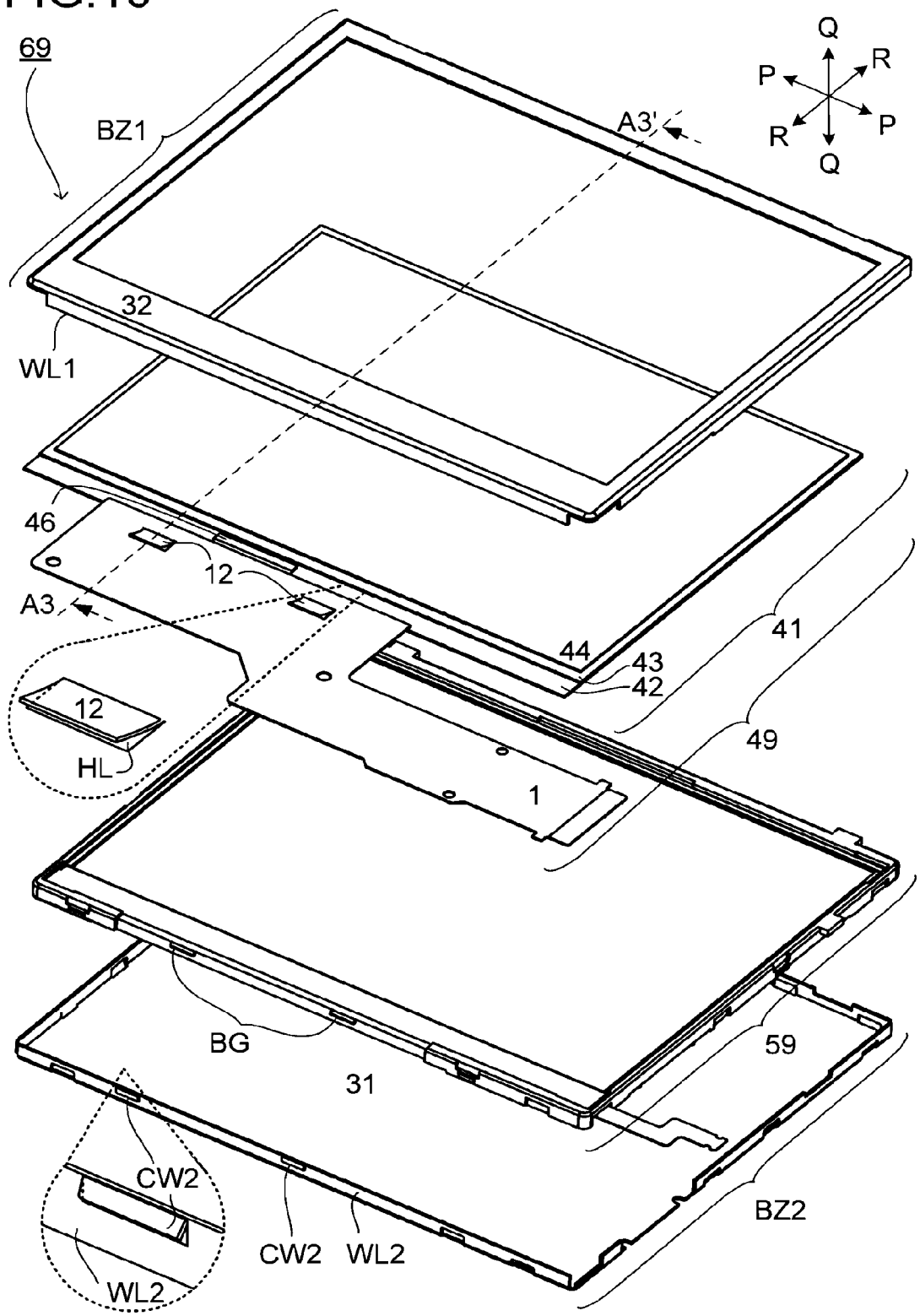
[FIG. 10] is an exploded perspective view of a liquid crystal display device different from the liquid crystal display devices shown in FIGS. 2 and 7.

This ground portion 12 is connected to a conductive portion in the manner as shown in the sectional view of FIG. 9 (incidentally, the sectional view of FIG. 9 is taken along line A3-A3' of FIG. 10 and viewed from the direction indicated by arrows shown in FIG. 10). That is, a liquid crystal display panel unit 49 is first placed to cover a built-in chassis CS of a backlight unit 59, an FPC board 1 is bent so as to cover the outer side of a thick side-wall WL3 of the built-in chassis CS, and the FPC board 1 is further bent so as to cover a reflection sheet 55 as well.

The ground portion 12 of the FPC board 1 faces a bulge BG of the thick side-wall WL3, and the ground portion 12 is bent upward from the board surface of the FPC board 1 by being pressed by the bulge (press member) BG. In this state, the thin ground portion 12 covers the thick side-wall WL3 with a distance from the thick side-wall WL3.

Furthermore, the backlight unit 59 that supports the liquid crystal display panel unit 49 in this way is housed within a rear bezel BZ2. Note that the ground portion 12 is placed so as to cover the outer side of an inner side-wall WL2 of the rear bezel BZ2.

With this structure, when a front bezel BZ1 is put in place as a lid with respect to the rear bezel BZ2, the inner side of an outer side-wall WL1 of the front bezel BZ1 and the outer side of an inner side-wall WL2 of the rear bezel 2 face each other with the ground portion 12 interposed between the outer side-wall WL1 and the inner side-wall WL2. In particular, the thin ground portion 12 is pressed by the bulge BG toward the outer side-wall WL1 formed of conductive material, and this makes it easy for the ground portion 12 to be in contact with the outer side-wall WL1.

Moreover, if an outer claw CW1 is formed in the outer side-wall WL1, and an inner claw CW2 is formed in the inner side-wall W2, the ground portion 12 is securely held between the claws CW1 and CW2. Thus, static electricity securely flows via the ground portion 12 to the outer and inner claws CW1 and CW2 (and thus to the front and rear bezels BZ1 and BZ2). This helps prevent various malfunctions caused by static electricity.

In addition, the ground portion 12, which is formed as a thin portion, is movable along a distance corresponding to the distance along which it moves to stand up from the FPC board 1, and this helps further increase the freedom in positioning the claws CW.

Incidentally, in FIGS. 9 and 10, no stand-up portion SU is formed on the inner side-wall WL2 of the rear bezel BZ2, but a stand-up portion SU may be formed on the inner side-wall WL2 of the rear bezel BZ2. That is, the outer and inner claws CW1 and CW2 may be engaged with each other, with the stand-up portion SU and the bulge BG engaged with each other.

In the above description, the claws CW, the protrusion 35, the recess 36, and the stand-up portion SU are formed on side walls WL (outer and inner side-walls WL1 and WL2) of the bezel BZ, and the bulge BG is formed on the side wall WL (thick side-wall 3) of the built-in chassis CS, but this is not meant as a limitation.

However, if the claws CW, the protrusion 35, the recess 36, the stand-up portion SU, and the bulge BG are provided on the side walls WL, their existence does not lead to an increased thickness of the liquid crystal display device 69 (and of course, the thickness of the panel unit does not increase, either).

[Other Embodiments]

It should be understood that the embodiments specifically described above are not meant to limit the present invention, and that many variations and modifications can be made within the spirit of the present invention.

For example, although the position of the ground portion 12 is not restricted by the FPC board 1, there is a desirable position for the ground portion 12. Such a desirable position of the ground portion 12 will be described with reference to FIGS. 11 and 12, along with the positions of the driver conductors 47 (47M, 47S) extending from the driver 46, and the positions of the supply conductors 11 (11M, 11S) formed on the FPC substrate 1.

Figure 11:
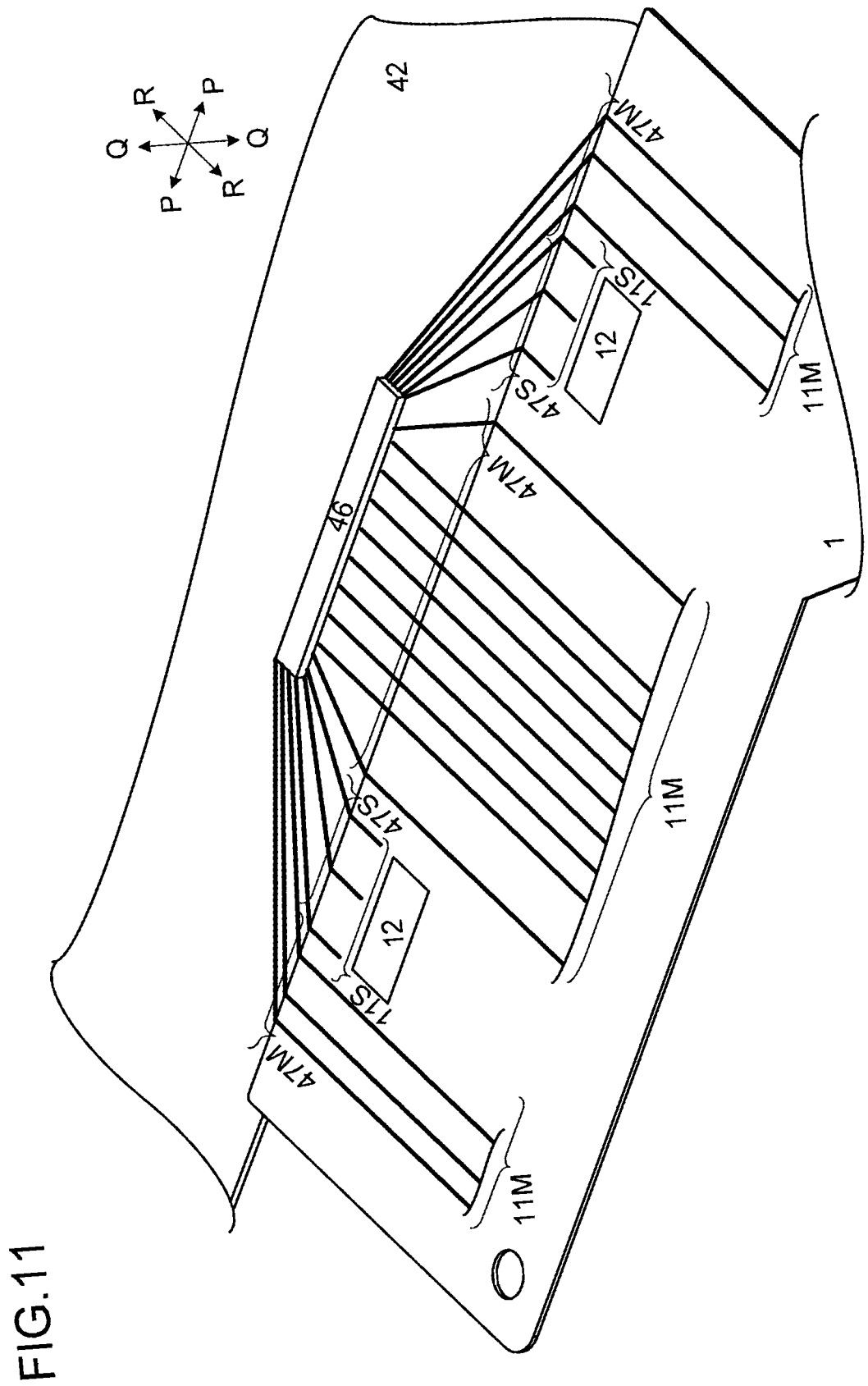
[FIG. 11] is a perspective view enlarging and showing part in the vicinity of a ground portion of an FPC board.
Figure 12:
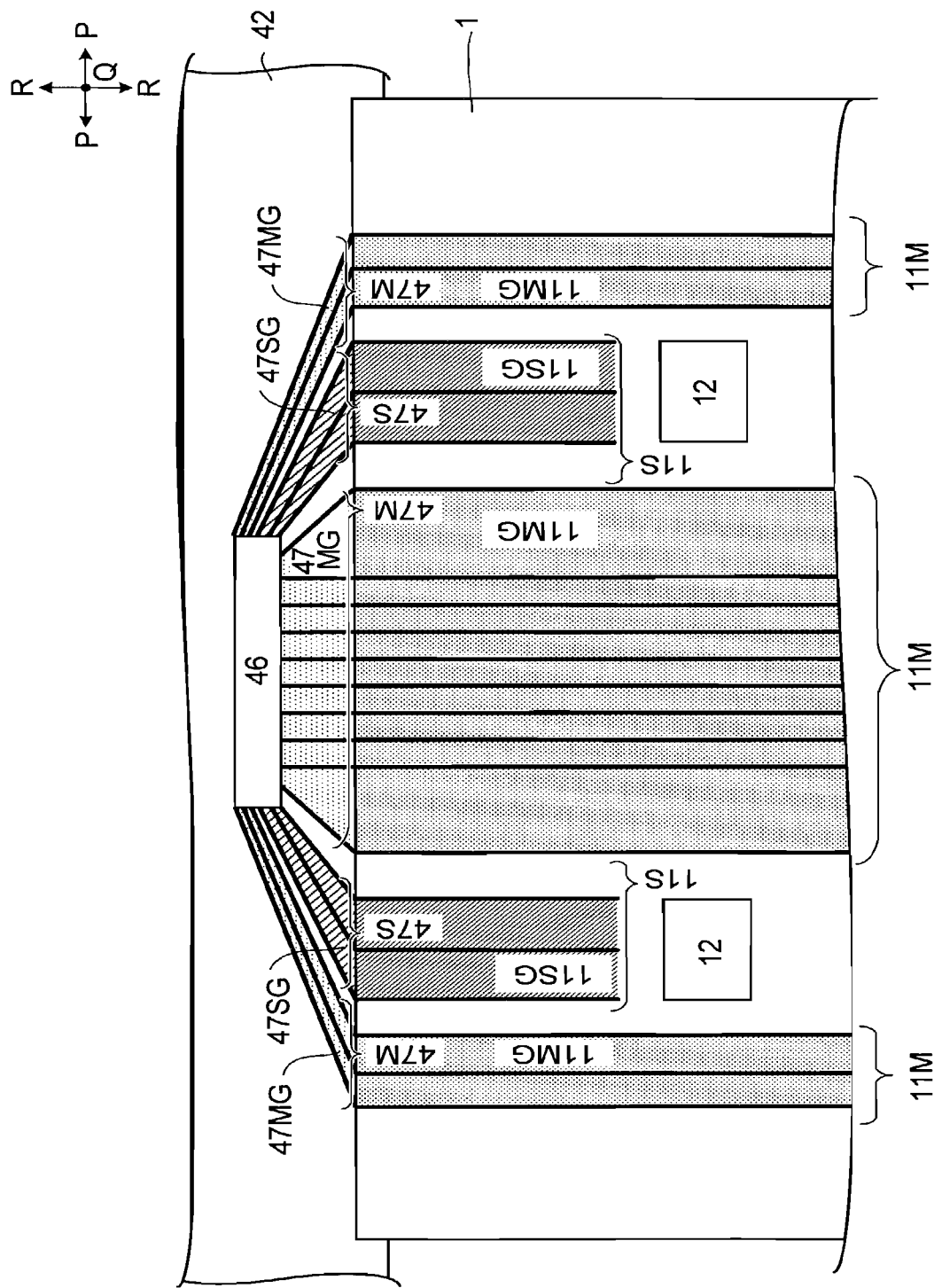
[FIG. 12] is a plan view showing the FPC board, an active matrix substrate, and a driver shown in FIG. 11.

FIG. 11 is a perspective view enlarging and showing part in the vicinity of a ground portion 12 of an FPC board 1, FIG. 12 is a plan view of FIG. 11. Here, merely part of driver conductors (element conductors) 47 and supply conductors 11 are shown in the figures for the sake of convenience.

The direction in which the bend line BR extends in FIG. 4 is the same as the crossing direction R in FIGS. 11 and 12 showing the FPC board 1 in the flat state (that is, the bend line BR assumed in the FPC board 1 in a bent state is a straight line in the FPC board 1 in the flat state).

Furthermore, an arrangement direction in which the driver 46 and the FPC board 1 are arranged side by side, the arrangement direction being the direction for connecting the driver 46 and the FPC board 1 with the shortest distance therebetween, may be the same as the crossing direction R, or may be the same as an extension direction along which the bend line BR of the FPC board 1 extends (hereinafter, the arrangement direction will sometimes be denoted by sign R, which also denotes the crossing direction R).

As shown in FIGS. 11 and 12, the driver conductors 47 are arranged to radially extend from the driver 46 (this arrangement, however, is not meant as a limitation). The driver conductors 47 include two types of driver conductors 47 (47M and 47S).

One type is control driver conductors (main element conductors) 47M used for controlling the liquid crystal display panel 41, and the other type is checking driver conductors (sub element conductors) 47S for checking the operation of the driver 46. Furthermore, the control driver conductors 47M and the checking driver conductors 47S are densely arranged by type to form groups each including either control driver conductors 47M or checking driver conductors 47S.

In FIG. 12, a control-driver-conductor group (main-element-conductor group) 47MG, a group of the control driver conductors 47M, is indicated by a coarsely dotted area, while a check-driver-conductor group (sub-element-conductor group) 47SG, a group of the check driver conductors 47S, is indicated by a coarsely hatched area.

On the other hand, a plurality of supply conductors 11 extend along the arrangement direction R and are aligned in a direction that crosses the arrangement direction R (for example, the alignment direction P). And, these supply conductors 11 are each connected to a corresponding one of the plurality of driver conductors 47 (the control driver conductors 47M, the check driver conductors 47S). Thus, the supply conductors 11 include two types of supply conductors 11 (11M, 11S) that correspond to the control driver conductors 47M and the check driver conductors 47S, respectively.

That is, one type is a control supply conductor (main supply conductor) 11M for controlling that is connected to a control driver conductor 47M, and the other type is a check supply conductor (sub supply conductor) 11S for checking that is connected to a check driver conductor 47S. These control and check supply conductors for controlling and checking, respectively, are also densely arranged by type to form groups each including either control supply conductors 11M or check supply conductors 11S.

In FIG. 12, a control-supply-conductor group (main-supply-conductor group) 11MG, a group of the control supply conductors 11M, is indicated by a densely dotted area, while a check-supply-conductor group (sub-supply-conductor group) 11SG, a group of the check supply conductors 11S, is indicated by a densely hatched area.

The check supply conductors 11S do not need to be connected to a power supply (not shown) like the control supply conductors 11M. Thus, as shown in FIGS. 11 and 12, the check supply conductors 11S are cut halfway.

In this way, the two types of supply-conductor-11 groups 11MG and 11SG are laid on the FPC board 1 apart from each other. And the ground portion 12 is located on the bend line BR overlapping a check-supply-conductor group 11SG (for example, the ground portion 12 is located at an extraction direction side of the check-supply-conductor group 11SG). That is, on the FPC board 1, the ground portion 12 is located at an isolation position avoiding the control-supply-conductor groups 11MG.

With this structure, for example, the control supply conductors 11M do not need to have extra length for avoiding the ground portion 12. As a result, not only the cost for the FPC board 1 is reduced, but also the control supply conductors 11M can be easily provided on the FPC board 1.

The control supply conductors 11M are not restricted by the position of the ground portion 12, and thus the control supply conductors 11M preferably have a shape that can follow the shape of the bending FPC board 1, that is, a linear shape along the bend line BR (in short, the extraction direction of the control supply conductors 11M is preferably the same as the arrangement direction R).

Normally, a load applied to a control supply conductor 11M in an oblique direction tends to damage the control supply conductor 11M. To prevent this, in a case in which a control supply conductor 11M that is located next to the ground portion 12 bends corresponding to the FPC board 1 bending at a portion thereof in the vicinity of the ground portion 12, it is preferable that no oblique load be applied to the bending control supply conductor 11M. For this reason, it is preferable that the control supply conductors 11M be formed in a linear shape extending along the bend line BR of the FPC board 1.

Incidentally, there is no need of forming all the control supply conductors 11M in a linear shape extending along the bend line BR of the FPC board 1. For example, there may be a case in which merely part of the control supply conductors 11M are located where the FPC board 1 bends (of course, there may be a case in which all of the control supply conductors 11M are located where the FPC board bends).

Thus, such control supply conductors 11M that are located where the FPC board 1 bends may be formed to have a shape that follows the shape of the bending FPC board 1. With this structure, no oblique load is applied to a control supply conductor 11 when it bends according to the bending of the FPC board 1.

Figure 13:
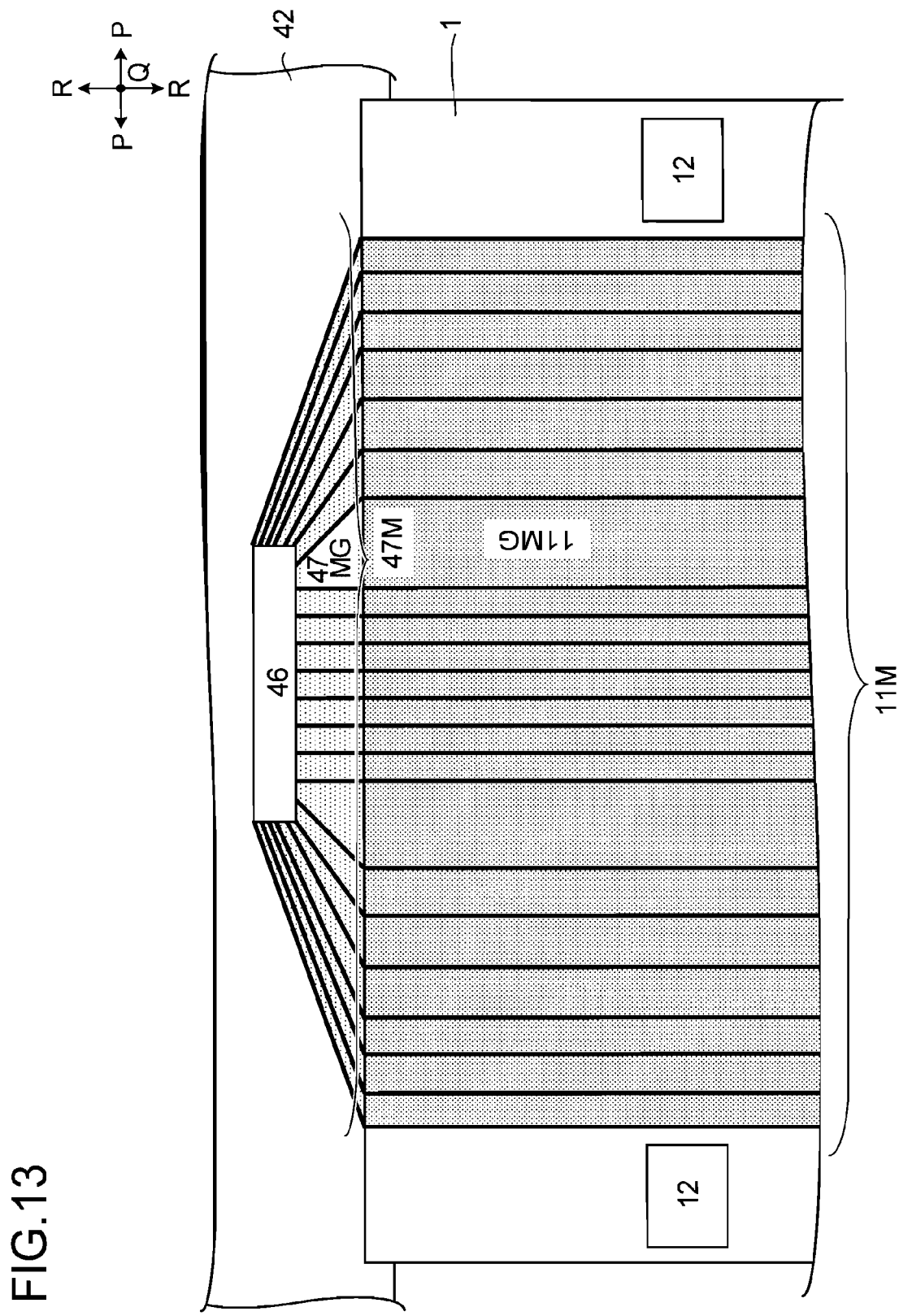
[FIG. 13] is a plan view showing an FPC board, an active matrix substrate, and a driver different from the FPC board, the active matrix substrate, and the driver shown in FIG. 12.

The ground portion 12 is located at an isolation position avoiding the control-supply-conductor groups 11MG; however, for example, a case is possible where, as shown in the plan view of FIG. 13, no check driver conductor 47S is provided and accordingly no check supply conductor 11S is provided. In such a case, the ground portion 12 is located at an outer edge of the FPC board 1 where no control-supply-conductor group 11MG is located.

Figure 14:
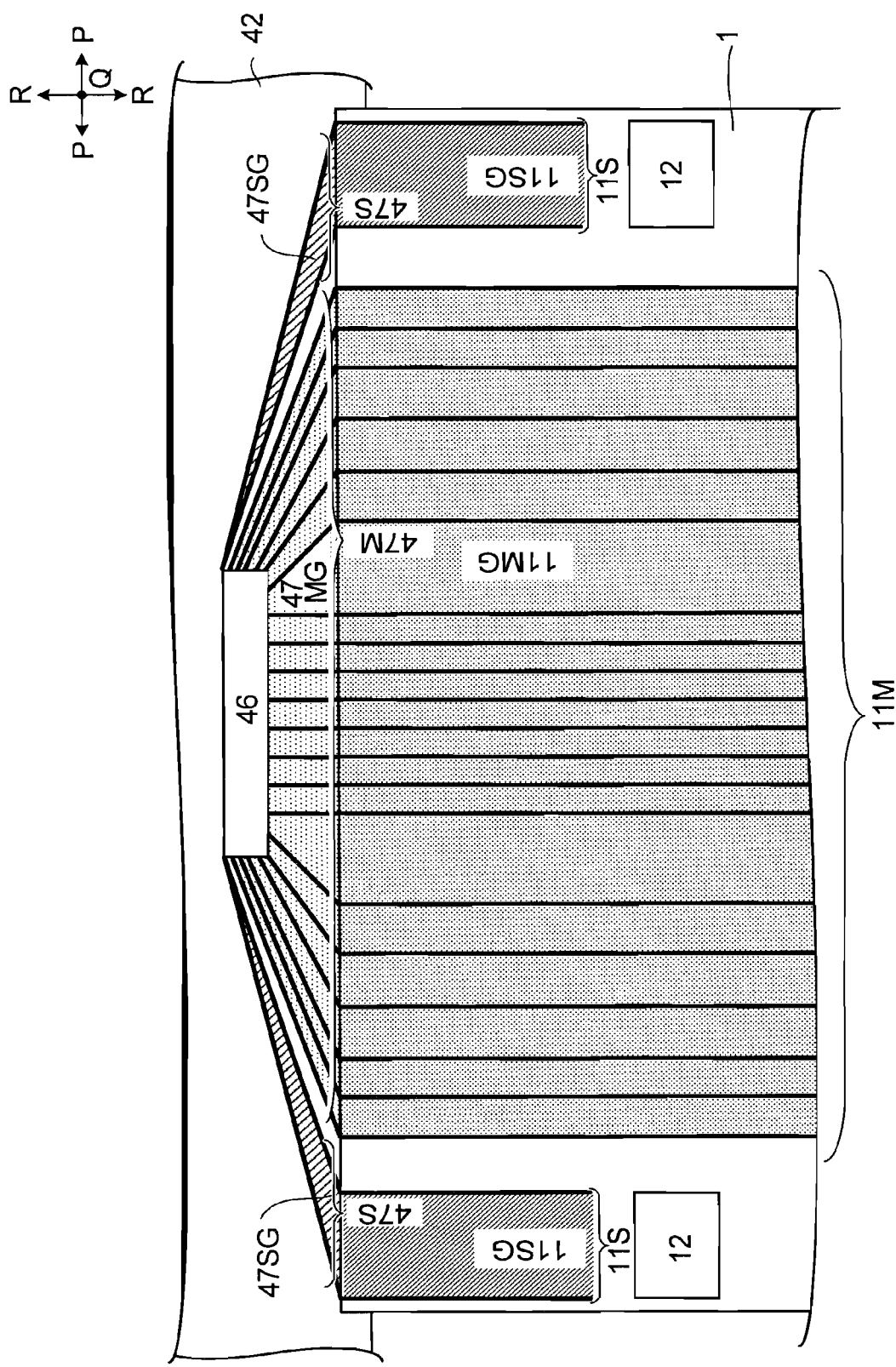
[FIG. 14] is a plan view showing an FPC board, an active matrix substrate, and a driver different from the FPC boards, the active matrix substrates, and the drivers shown in FIGS. 12 and 13.

In other words, the ground portion 12 may be located anywhere as long as it does not overlap a control-supply-conductor group 11MG; as shown in the plan view of FIG. 14, the ground portion 12 may be located at a position along an outer edge of the FPC board 1 and on the bend line BR that overlap a check-supply-conductor group 11SG.

Although the above descriptions deal with the front and rear bezels BZ1 and BZ2, and the built-in chassis CS as members (housings) that engage with each other, but this is not meant as a limitation. There are used two members that engage with each other, but three or more of such members may be used. That is, a plurality of members each including an engagement portion (such as a claw CW or the like) are engaged with each other (to be united) by the engagement portions (at least two engagement portions) engaging with each other.

Finally, it can be said that the present invention includes electronic devices such as laptop computers, mobile phones, and PDAs (personal digital assistants) incorporating a display like the above-described liquid crystal display device 69.

The invention claimed is:

1. An electronic package, comprising
a housing unit that is composed of a plurality of housings integrally engaged with each other, and
a circuit board that is incorporated in the housing unit, and that includes a supply conductor,
wherein
at least one of the housings that are engaged with each other is formed of electrically conductive material,
the housings include engagement portions that engage with each other to unite the housings,
the engagement portions are located on side walls of the housing unit, and
a ground portion in the circuit board is curved to cover a side wall of at least one of the housings and is held by and between the engagement portions.

2. The electronic package of claim 1, wherein
the ground portion is film-shaped,
he engagement portions, which engage with each other, are claw-shaped, and
the claw-shaped engagement portions interlock with each other with the ground portion interposed therebetween.

3. The electronic package of claim 2, wherein the claw-shaped engagement portions are fonned by raising cut portions formed in the housings.

4. The electronic package of claim 1, wherein
the ground portion is film-shaped,
of the engagement portions engaging each other, one is a protrusion-shaped engagement portion, another is a recess-shaped engagement portion, and
the protrusion-shaped engagement portion and the recess-shaped engagement portion are engaged with each other with the film-shaped ground portion interposed therebetween.

5. The electronic package of claim 1, wherein
the ground portion is a thin portion formed by raising a cut portion of the circuit board, and
the ground portion, which is thin, is pressed by a press member against the housings, which are formed of electrically conductive material.

6. A display comprising the electronic package of claim 1.

7. The display of claim 6, wherein
the circuit board is connected to a display panel on which a display image is displayed, the display panel having a control element placed thereon along the circuit board,
the control element includes a plurality of element conductors, a main-element-conductor group, which is a group of main element conductors, being included in the element conductors, and,
supply conductors of the circuit board that are connected to the main element conductors are main supply conductors, and that a group of the main supply conductors is a main-supply-conductor group, the ground portion is located at an isolation position avoiding the main-supply-conductor group.

8. The display of claim 7, wherein the isolation position is a position in the circuit board along an outer edge of the circuit board.

9. The display of claim 7, wherein a sub-element-conductor group, which is a group of sub element conductors, is included in the plurality of element conductors, and, supply conductors of the circuit board that are connected to the sub element conductors are sub supply conductors, that a group of the sub element conductors is a sub-supply-conductor group, and that a line along a shape of the circuit board which bends is a bend line, the isolation position is located on the bend line that overlaps the sub-supply-conductor group.

10. The display of claim 7, wherein at least part of the main supply conductors are located at a bending portion of the circuit board, and the at least part of the main supply conductors that are located at the bending portion of the circuit board are shaped to fit the shape of the circuit board that bends.

11. An electronic device comprising the display of claim 6.

* * * * *